United States Patent
Tsai et al.

(10) Patent No.: US 9,620,414 B2
(45) Date of Patent: Apr. 11, 2017

(54) PROTECTING FLIP-CHIP PACKAGE USING PRE-APPLIED FILLET

(71) Applicant: Taiwan Semiconductor Manufacturing Company, Ltd., Hsin-Chu (TW)

(72) Inventors: Tsung-Fu Tsai, Changhua (TW); Yian-Liang Kuo, Toufen Township (TW); Ming-Song Sheu, Hsin-Chu (TW); Yu-Ling Tsai, Hsin-Chu (TW); Chen-Shien Chen, Zhubei (TW); Han-Ping Pu, Taichung (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 43 days.

(21) Appl. No.: 14/745,595

(22) Filed: Jun. 22, 2015

(65) Prior Publication Data
US 2015/0287640 A1     Oct. 8, 2015

Related U.S. Application Data

(62) Division of application No. 12/944,453, filed on Nov. 11, 2010, now Pat. No. 9,064,881.

(51) Int. Cl.
*H01L 23/29* (2006.01)
*H01L 21/78* (2006.01)
(Continued)

(52) U.S. Cl.
CPC ........ *H01L 21/78* (2013.01); *H01L 21/02013* (2013.01); *H01L 21/02016* (2013.01);
(Continued)

(58) Field of Classification Search
CPC ......... H01L 23/10; H01L 23/18; H01L 23/28; H01L 23/31; H01L 23/40; H01L 23/488; H01L 23/52; H01L 23/528; H01L 23/538
(Continued)

(56) References Cited

U.S. PATENT DOCUMENTS 5,563,084 A * 10/1996 Ramm ................ H01L 21/6835
  148/DIG. 135
5,581,122 A   12/1996 Chao et al.
(Continued)

FOREIGN PATENT DOCUMENTS

WO    02103784    12/2002

OTHER PUBLICATIONS

"Guideline for Selection and Application of Underfill Material for Flip Chip and other Micropackages," Draft 7 Underfill Adhesives for Flip Chip Applications Task Group (5-24f), J-STD-030, Dec. 2000, 24 pgs., IPC Association Connecting Electronics Industries.
(Continued)

*Primary Examiner* — Kyoung Lee
*Assistant Examiner* — Joannie Garcia
(74) *Attorney, Agent, or Firm* — Slater Matsil, LLP (57) ABSTRACT

A die has a first surface, a second surface opposite the first surface, and sidewalls includes a first portion and a second portion, wherein the first portion is closer to the first surface than the second portion. A fillet contacts the first portion of sidewalls of the die and encircles the die. A work piece is bonded to the die through solder bumps, with the second surface facing the work piece. A first underfill is filled a gap between the die and the work piece, wherein the first underfill contacts the fillet, and wherein the first underfill and the fillet are formed of different materials.

19 Claims, 11 Drawing Sheets (51) Int. Cl.
*H01L 21/56* (2006.01)
*H01L 23/00* (2006.01)
*H01L 21/02* (2006.01)

(52) U.S. Cl.
CPC .......... *H01L 21/563* (2013.01); *H01L 23/295* (2013.01); *H01L 23/562* (2013.01); *H01L 24/32* (2013.01); *H01L 24/743* (2013.01); *H01L 24/81* (2013.01); *H01L 2224/16225* (2013.01); *H01L 2224/26145* (2013.01); *H01L 2224/27013* (2013.01); *H01L 2224/32225* (2013.01); *H01L 2224/73204* (2013.01); *H01L 2224/81009* (2013.01); *H01L 2224/81191* (2013.01); *H01L 2224/83104* (2013.01); *H01L 2224/83192* (2013.01); *H01L 2224/92125* (2013.01); *H01L 2924/10156* (2013.01); *H01L 2924/14* (2013.01)

(58) Field of Classification Search
USPC ........ 257/107, 108, 110, 112, 113, 114, 118, 257/125, 126, 127, 700
See application file for complete search history.

(56) References Cited

U.S. PATENT DOCUMENTS

| | | |
|---|---|---|
| 5,866,943 A | 2/1999 | Mertol |
| 6,245,595 B1* | 6/2001 | Nguyen et al. ............... 438/108 |
| 6,265,784 B1 | 7/2001 | Kawano et al. |
| 6,316,287 B1 | 11/2001 | Zandman et al. |
| 6,323,551 B1 | 11/2001 | Anzai |
| 6,338,980 B1* | 1/2002 | Satoh .................... H01L 21/561 257/E21.508 |
| 6,372,544 B1 | 4/2002 | Halderman et al. |
| 6,600,232 B2 | 7/2003 | Chiu et al. |
| 6,700,209 B1 | 3/2004 | Raiser et al. |
| 6,762,509 B2 | 7/2004 | Hilton et al. |
| 7,145,236 B2 | 12/2006 | Miura et al. |
| 7,247,934 B2 | 7/2007 | Pu |
| 7,372,151 B1 | 5/2008 | Fan et al. |
| 7,399,657 B2 | 7/2008 | Bolken et al. |
| 2004/0070087 A1 | 4/2004 | Wang et al. |
| 2004/0195701 A1 | 10/2004 | Attarwala |
| 2004/0235218 A1* | 11/2004 | Skindhoj ................. H01L 21/50 438/106 |
| 2007/0111390 A1 | 5/2007 | Komura et al. |
| 2009/0309238 A1 | 12/2009 | Loke |
| 2010/0181669 A1 | 7/2010 | Tanaka |

OTHER PUBLICATIONS

Kacker, K. et al., Impact of Underfill Fillet Geometry on Interfacial Delamination in Organic Flip Chip Packages, 2006 Electronic Components and Technology Conference, pp. 1604-1610, IEEE.

* cited by examiner

PROTECTING FLIP-CHIP PACKAGE USING PRE-APPLIED FILLET

PRIORITY CLAIM AND CROSS-REFERENCE

This application is a divisional of U.S. patent application Ser. No. 12/944,453, entitled "Protecting Flip-Chip Package using Pre-Applied Filler," filed on Nov. 11, 2010, which application is incorporated herein by reference.

BACKGROUND

In integrated circuit packaging processes, a die may be bonded onto a package substrate using flip-chip bonding, wherein solder bumps are used to join the bond pads on the die to the bond pads on the package substrate. After the solder bumps are reflowed, an underfill is disposed into the gap between the die and the package substrate. The underfill is then cured, and the solder bumps are protected by the underfill.

In conventional flip-chip packaging, the underfill is filled into the gap between the die and the package substrate through capillary underfill dispensing. As a result, depending on the viscosity of the underfill, although some of the underfill may climb on the sidewalls of the die, the underfill is typically limited to be on the lower parts of the sidewalls of the die, if it ever climbs on the sidewalls of the die. It is less likely that the underfill may climb on the upper parts of the sidewalls of the die. Situation also occurs that the underfill may not climb on any portion of the sidewalls of the die at all. Lacking underfill at the corners of the die causes an increase in the risk of the delamination between different layers in the die and the delamination between the die and the underfill.

BRIEF DESCRIPTION OF THE DRAWINGS

For a more complete understanding of the embodiments, and the advantages thereof, reference is now made to the following descriptions taken in conjunction with the accompanying drawings, in which:

FIGS. 1A through 3B illustrate top views and cross-sectional views of intermediate stages in the formation of fillets on sidewalls of dies;

DETAILED DESCRIPTION OF ILLUSTRATIVE EMBODIMENTS

The making and using of the embodiments of the disclosure are discussed in detail below. It should be appreciated, however, that the embodiments provide many applicable inventive concepts that can be embodied in a wide variety of specific contexts. The specific embodiments discussed are merely illustrative, and do not limit the scope of the disclosure.

A novel package structure and the method of forming the same are provided in accordance with an embodiment. The intermediate stages of manufacturing the embodiment are illustrated. The variations of the embodiment are then discussed. Throughout the various views and illustrative embodiments, like reference numbers are used to designate like elements.

Figure 1A:
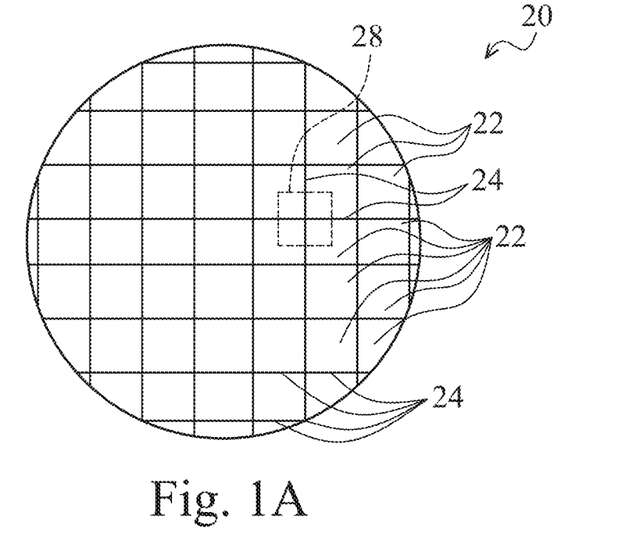

FIG. 1A illustrates a top view of wafer 20. Wafer 20 includes a plurality of dies (also known as chips in the art) 22, and scribe lines 24 spacing dies 22 from each other. Scribe lines 24 include portions extending in a first direction and portions in a second direction perpendicular to the first direction. Dies 22 may include integrated circuits comprising, for example, complementary metal-oxide-semiconductor (CMOS) devices (not shown), which are formed on a semiconductor substrate (not shown) in wafer 20.

Figure 1B:
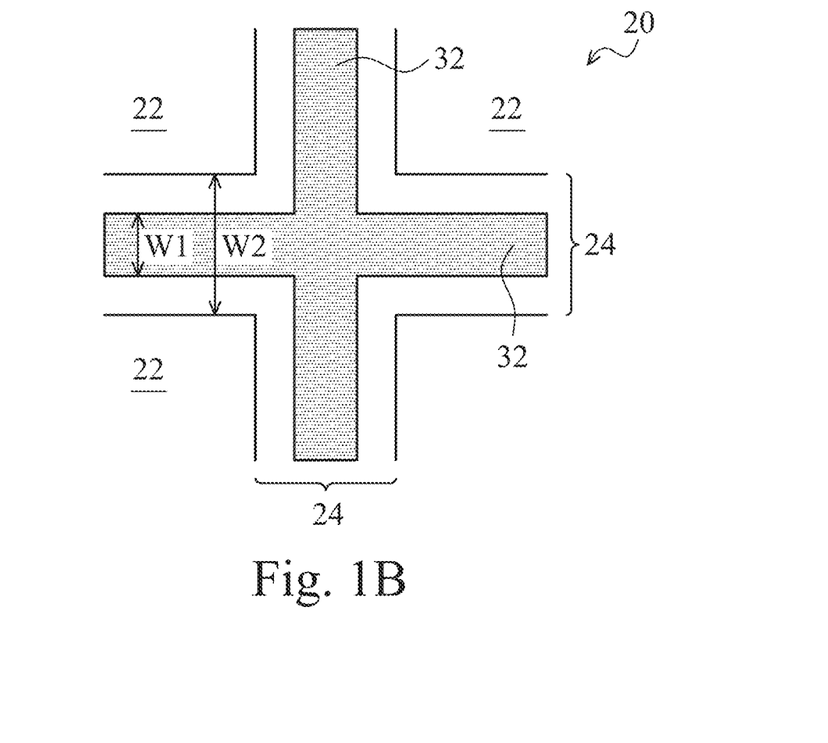
Figure 1C:
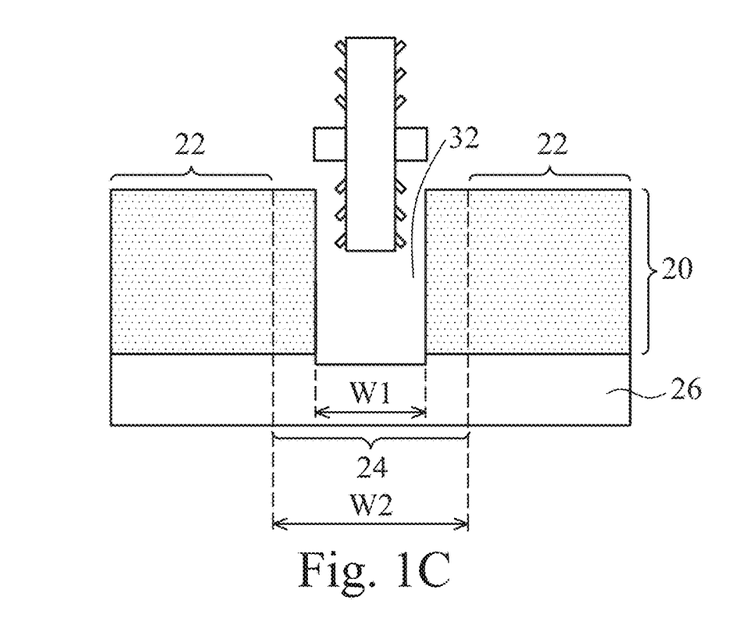

Referring to FIG. 1C, which is a cross-sectional view of the structure shown in FIG. 1A, wafer 20 is adhered on tape 26. In an embodiment, the back surface of wafer 20, which back surface may be the back surface of the respective semiconductor substrate therein (not shown), contacts tape 26. In alternative embodiments, the front surface of wafer 20, which may include solder bumps 44 (not shown in FIG. 1C, please refer to FIG. 4) thereon, may contact tape 26.

FIG. 1B is a magnified view of portion 28 of wafer 20 (FIG. 1A). A first die sawing is performed to saw through scribe lines 24, wherein trenches 32 are formed to separate dies 22 apart from each other. In the first die sawing, all of the scribe lines 24 in wafer 20 may be sawed. As shown in FIG. 1C, although trenches 32 may separate dies 22 into discrete dies, since dies 22 are adhered to tape 26, dies 22 are still being hold on their original positions. The bottom surface of trenches 32 may be level with the bottom surface of wafer 20, and may also slightly extend into tape 26 to ensure dies 22 are separated. Furthermore, width W1 of trenches 32 is smaller than width W2 of scribe lines 24. In an embodiment, width W1 is between about 50 and about 200 μm. It is realized, however, that the dimensions recited throughout the description are merely examples, and may be changed, for example, if different formation technologies are used. After the die sawing, a cleaning may be performed to remove the particles generated in the first die sawing.

Figure 2A:
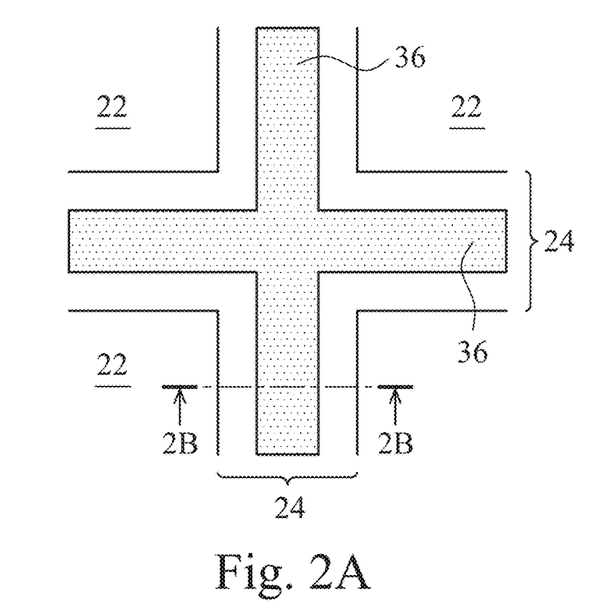
Figure 2B:
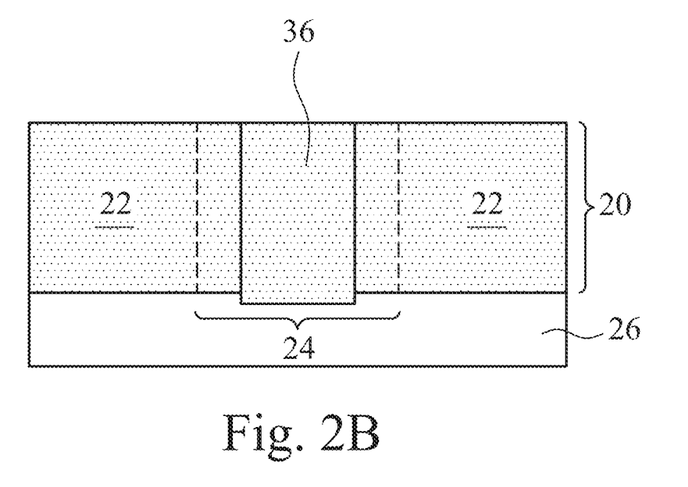

Referring to FIG. 2A, which is a top view of portion 28 (FIG. 1A), trenches 32 are filled with fillet material 36, which is in a liquid form, and can be cured to convert to a solid material. The top surface of fillet material 36 may be substantially level with a top surface of wafer 20, as shown in FIG. 2B, which is a cross-sectional view of the structure shown in FIG. 2A, with the cross-sectional view being obtained from the plane crossing line 2B-2B in FIG. 2A. In an embodiment, fillet material 36 is an underfill. In alternative embodiments, other materials such as resin, polyimide, and parylene can be used. Furthermore, fillet material 36 may be a dielectric material. Trenches 32 as shown in FIG. 1C may be fully filled with fillet material 36, as shown in FIG. 2B, or partially filled. The filling method includes capillary filling, screen printing, jetting, chemical vapor deposited (CVD), and the like. After the filling, as shown in FIG. 2B, fillet material 36 fills at least lower portions of trenches 32, and possibly an entirety of trenches 32 is filled, with the top surface of fillet material 36 level with the top surface of wafer 20.

After the filling of fillet material 36, a pre-cure process may be performed to partially cure fillet material 36. For example, the curing time of the pre-cure process may be less than a half of, or less than a third of, the minimum time needed to fully cure fillet material 36. As a result, after the pre-cure, fillet material 36 may still be slightly adhesive, and is not fully solidified yet. Alternatively, the pre-cure may fully cure fillet material 36. In an exemplary embodiment, the pre-cure may be performed at about 150° C. for about 10 minutes. It is observed that tape 26 should not be damaged by the pre-cure. Accordingly, an appropriate type of tape 26 needs to be selected, and/or the pre-cure temperature needs to be lowered to a temperature not damaging tape 26.

Figure 3A:
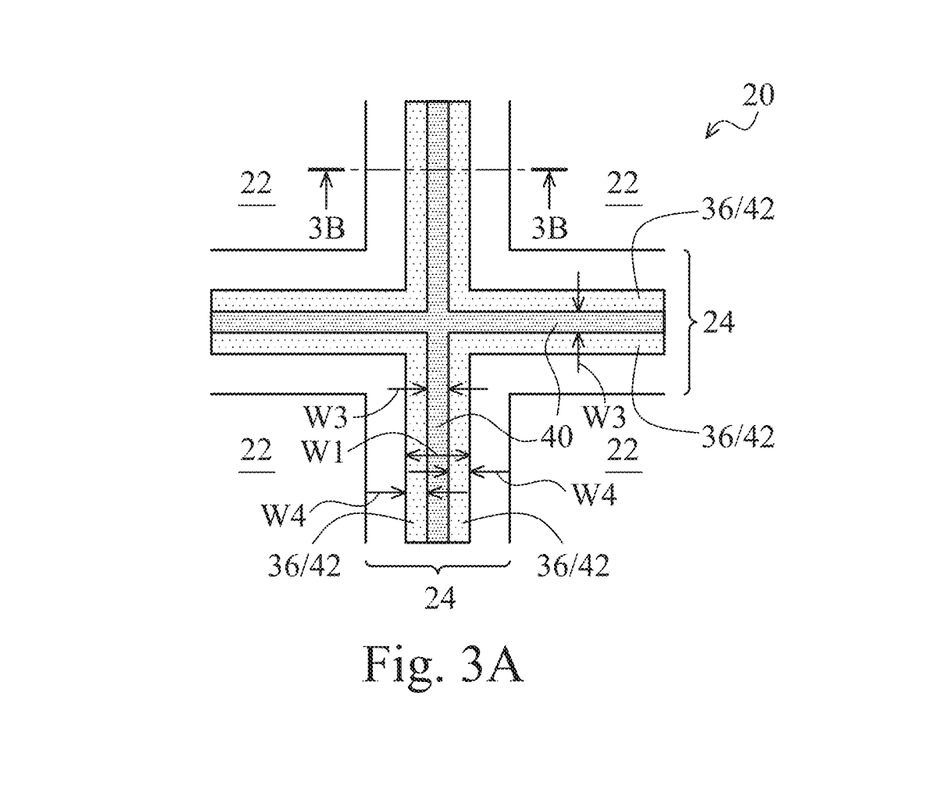
Figure 3B:
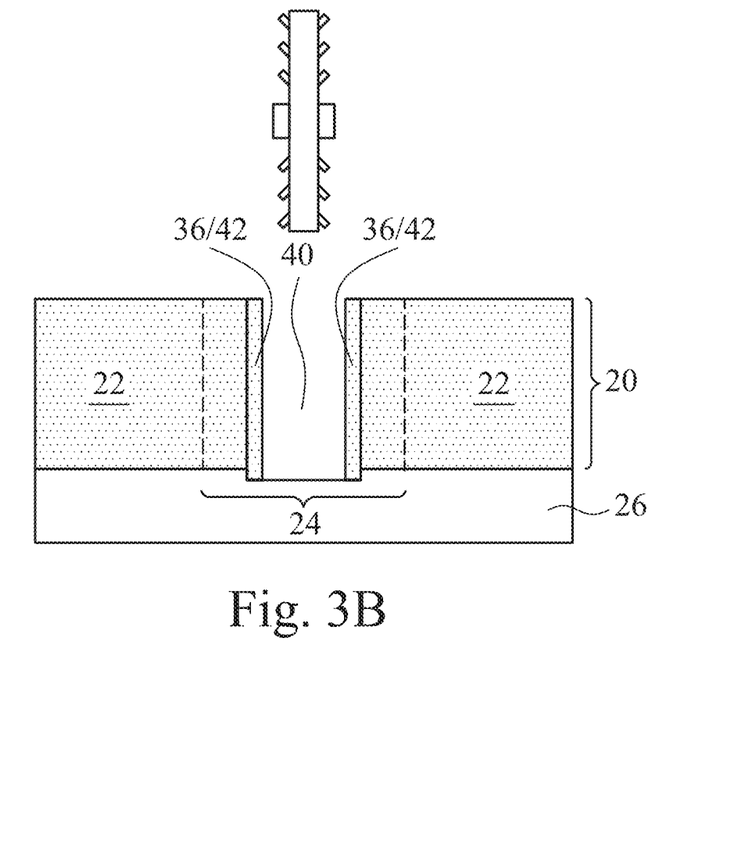

Referring to FIG. 3A, which is the top view of portion 28 (FIG. 1A) of wafer 20, a second die sawing is performed to generate trenches 40 in fillet material 36. Width W3 of trenches 40 is smaller than width W1 of fillet material 36. In an embodiment, ratio W3/W1 is between about 0.2 and about 0.8, and may also be between about 0.4 and 0.6. Further, trenches 40 may be located in the middle of the respective fillet material 36, so that the remaining portions of fillet material 36 on opposite sides of the respective trenches 40 have equal widths W4. In an exemplary embodiment, width W1 is about 100 μm, and width W3 is about 50 μm. Accordingly, width W4 of the remaining portions (referred to as fillets 42 hereinafter) of fillet material 36 may be about 25 μm, for example. FIG. 3B is a cross-sectional view of the structure shown in FIG. 3A, with the cross-sectional view obtained from the plane crossing line 3B-3B in FIG. 3A. The second die sawing is finished when the bottom of trenches 40 reaches, and possibly slightly passes, the bottom of fillet material 36.

Figure 4:
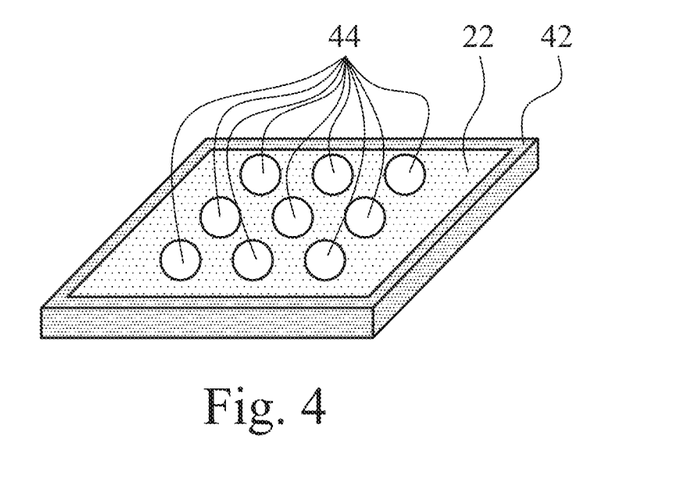
FIG. 4 illustrates a perspective view of a die with a fillet formed on the sidewalls of the die.

Next, dies 22 are separated from tape 26. FIG. 4 illustrates a perspective view of one of dies 22. It is observed that fillet 42 may be formed on, and contacting, all sidewalls of die 22, and encircles the respective die 22. Further, Fillet 42 may extend from substantially level with the top surface of die 22 to substantially level with the bottom surface of die 22 (also refer to FIG. 3B). In embodiments, fillet 42 may not extend directly over and contacting the top surface of die 22. In addition, fillet 42 may not extend directly underlying and contacting the bottom surface of die 22. Solder bumps 44 are shown as being located on a surface of die 22.

Figure 5:
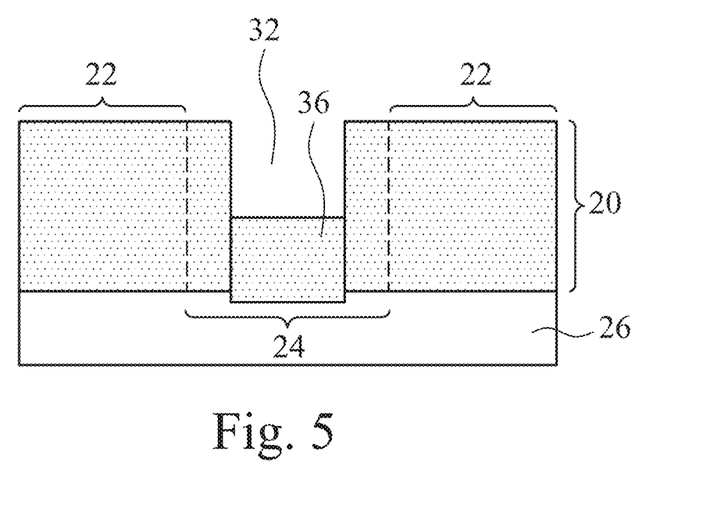
FIGS. 5 and 6 illustrate cross-sectional views of intermediate stages in the formation of fillets on sidewalls of dies, wherein the fillets cover lower portions of the sidewalls.
Figure 6:
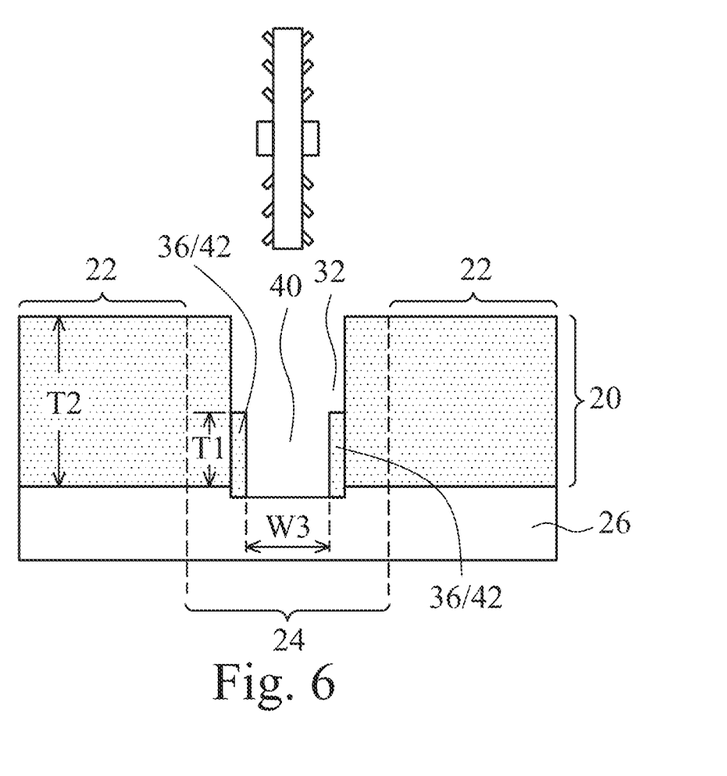
Figure 7:
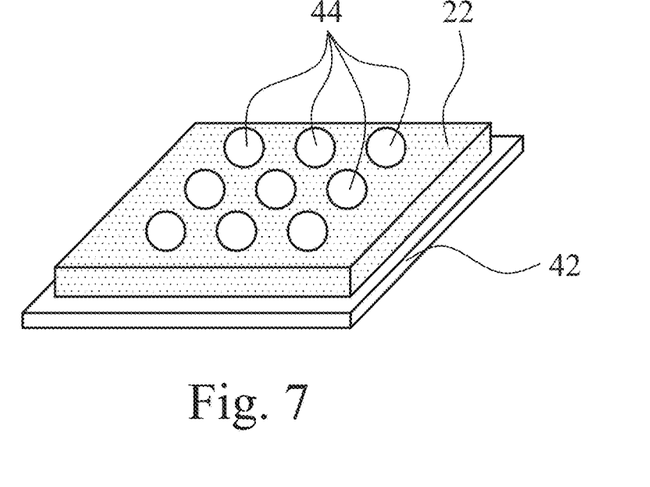
FIG. 7 illustrates a perspective view of a die with a fillet formed on portions of the sidewalls of the die.

FIGS. 5 through 7 illustrate the cross-sectional views of intermediate stages in the formation of fillet in accordance with an alternative embodiment, wherein fillet material 36 partially fills trenches 32. Referring to FIG. 5, after the first die sawing process as shown in FIGS. 1A through 1C is performed, fillet material 36 is filled into lower portions of trenches 32, while the upper portions of trenches 32 are not filled. The top view of the structure in FIG. 5 may also appear to be essentially the same as shown in FIG. 2A. Fillet material 36 used in this embodiment may be essentially the same as used in the embodiment shown in FIGS. 1A through 3B.

Next, as shown in FIG. 6, after the pre-cure of fillet material 36, the second die sawing is performed to form trenches 40. The process conditions of the second die sawing and the location and the width W3 of trenches 40 may be essentially the same as in the embodiment shown in FIGS. 1A through 3B. After the second die sawing, the portions of sidewalls of dies 22 covered by fillet 42 have thickness T1, wherein the thickness of dies 22 is T2. In an embodiment, ratio T1/T2 may be between about 1/2 and about 4/5, although different ratios may be used.

After the second die sawing is performed, dies 22 along with fillet 42 may be separated from tape 26. FIG. 7 illustrates a perspective view of one of dies 22. It is observed that in the resulting structure, fillet 42 only covers a portion (the lower portion in FIG. 7) of the sidewalls of die 22, while there is still a portion (the upper portion in FIG. 7) of the sidewalls of die 22 not covered by fillet 42.

Figure 8:
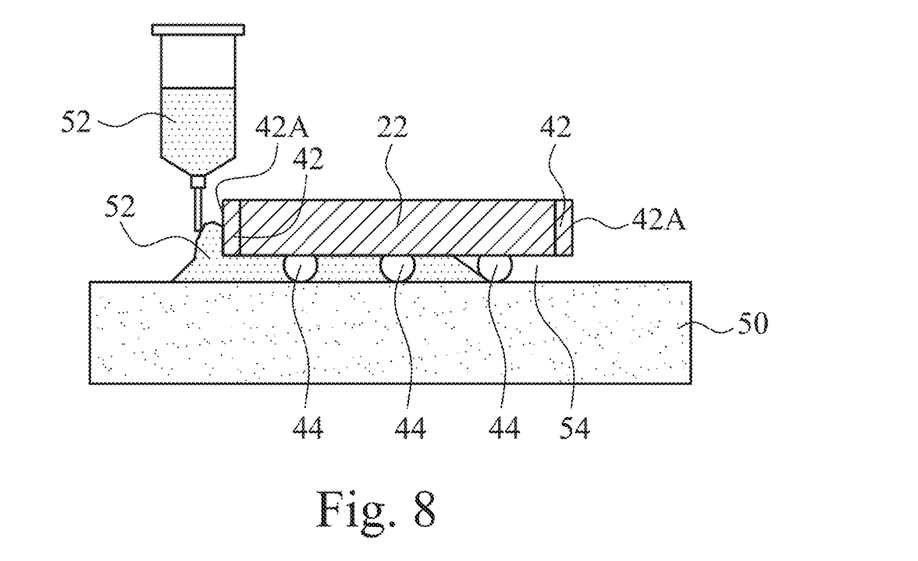
FIGS. 8 through 13 illustrate cross-sectional views of intermediate stages in the bonding of a die onto a package substrate.
Figure 9:
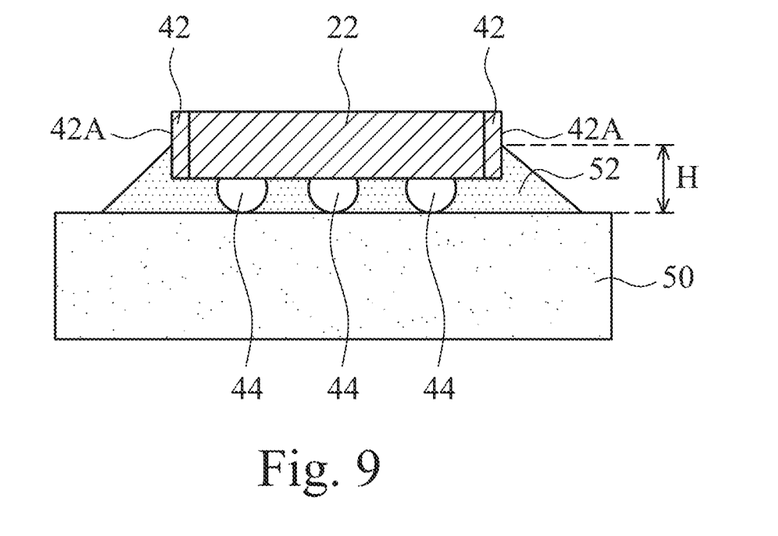
Figure 10:
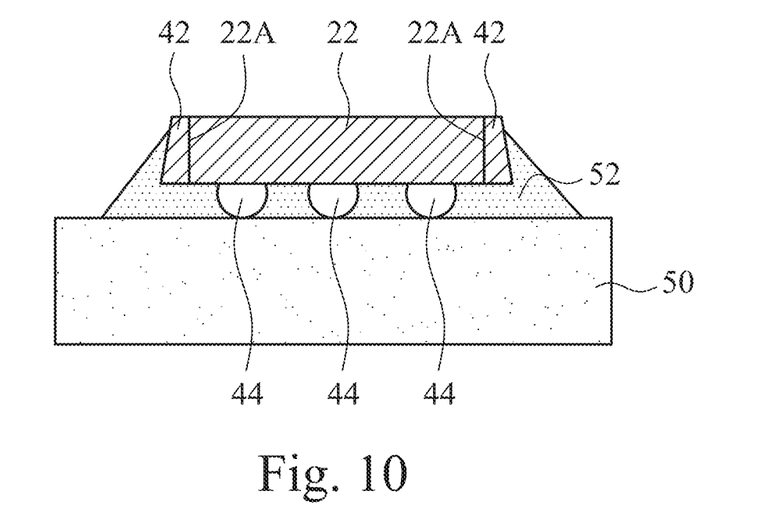

FIGS. 8 through 10 illustrate cross-sectional views of intermediate stages of a capillary underfill dispensing process. Referring to FIG. 8, die 22 is bonded to work piece 50, which may be a package substrate, a device die, an interposer, or the like. Solder bumps 44 are located between, and joining, die 22 and work piece 50. Next, underfill 52, which is in a liquid form, is filled into gap 54 between die 22 and work piece 50. Due to the capillary effect, underfill 52 fills an entirety of gap 54, and may possibly contact sidewalls 42A of fillet 42. FIG. 9 illustrates a resulting structure after the dispensing of underfill 52. A portion of sidewalls 42A of fillet 42 is covered by underfill 52. Height H of the resulting underfill 52 is related to the viscosity of underfill 52, and the greater the viscosity is, the higher the height H is. When viewed from top, underfill 52 may also encircle, and contact, at least the lower portion of fillet 42. Alternatively, an entirety of sidewalls 42A of fillet 42 is covered by underfill 52.

Next, as shown in FIG. 10, a curing is performed to fully cure fillet 42 and underfill 52. In an embodiment, the curing is performed at a temperature between about 130° C. and about 160° C., for example, for between about 20 minutes and about 40 minutes. Depending on the materials of fillet 42 and underfill 52, different temperatures and durations may be used for the curing process. After the curing process, fillet 42 may still contacts the entirety of sidewall 22A of die 22. Further, underfill 52 contacts fillet 42. Fillet 42 and underfill 52 have compatible characteristics, and hence have a good bonding to each other after the curing. The top end of underfill 52 may also be level with the top surface of die 22, the bottom surface of die 22, or may be at any level between the top surface and the bottom surface of die 22. Since fillet 42 covers the entirety of sidewall 22A of die 22, fillet 42 and underfill 52 in combination provide protection to all sidewall 22A and the corners of die 22.

Throughout the description, each of fillet 42 and underfill 52 includes a base material, which is a liquid before being cured. Each of fillet 42 and underfill 52 may possibly include a filler, which is in a solid form before and after the curing. In an embodiment, the filler may comprise ceramic materials such as silicon dioxide, aluminum oxide, or the like. In the structure shown in FIG. 10, fillet 42 and underfill 52 may be formed of the same material, which means that their base materials and fillers are substantially identical. Fillet 42 and underfill 52 are considered to be different from each other even if they include the same type of base material and the same type of filler if their percentages, such as weight percentages, of fillers are different. In alternative embodiments, fillet 42 and underfill 52 are formed of different materials. For example, fillet 42 may be formed of a resin that is compatible with underfill 52. The base material of fillet 42 and underfill 52 may be the same or different. The filler in fillet 42 and the filler in underfill 52 may also be formed of the same or different materials, although the (weight) percentage of the filler in fillet 42 and the (weight) percentage of the filler in underfill 52 may be the same or different. In an embodiment, there is more filler material in fillet 42 than in underfill 52.

Fillet 42 may have a coefficient of thermal expansion (CTE) closer to that of the CTEs of the semiconductor substrate and the dielectric materials (not shown) in die 22. Since the CTE of underfill is typically much greater than the CTEs of the substrate and the dielectric materials in die 22, the CTE of fillet 42 may be smaller than the CTE of underfill 52 (and greater than the CTE of the semiconductor substrate) in order to be closer to the CTE of the substrate and the dielectric materials. In an embodiment, the CTE of fillet 42 is smaller than the CTE of underfill 52 by 2 ppm/° C., by 5 ppm/° C., or by 10 ppm/° C. For example, the CTE of fillet 42 may be smaller than about 22 ppm/° C., smaller than 20 ppm/° C., or smaller than 15 ppm/° C., while the CTE of underfill 52 may be greater than about 20 ppm/° C., greater than about 25 ppm/° C., or even close to 30 ppm/° C. To reduce the CTE of fillet 42, the percentage of the filler in fillet 42 needs to be increased. In an embodiment, ratio P1/P2 of a first percentage (P1) of the filler in fillet 42 to a second percentage (P2) of the filler in underfill 52 is greater than about 1.1, greater than about 1.2, or even greater than about 1.5.

Furthermore, fillet 42 may be different from underfill 52 in their Young's modules. In an embodiment, fillet 42 has a greater Young's module than underfill 52, and the difference between the Young's modules of fillet 42 and underfill 52 is greater than about 2 GPa. In an exemplary embodiment, the Young's module of fillet 42 is greater than about 15 GPa, while the Young's module of underfill 52 is lower than about 13 GPa.

Figure 11:
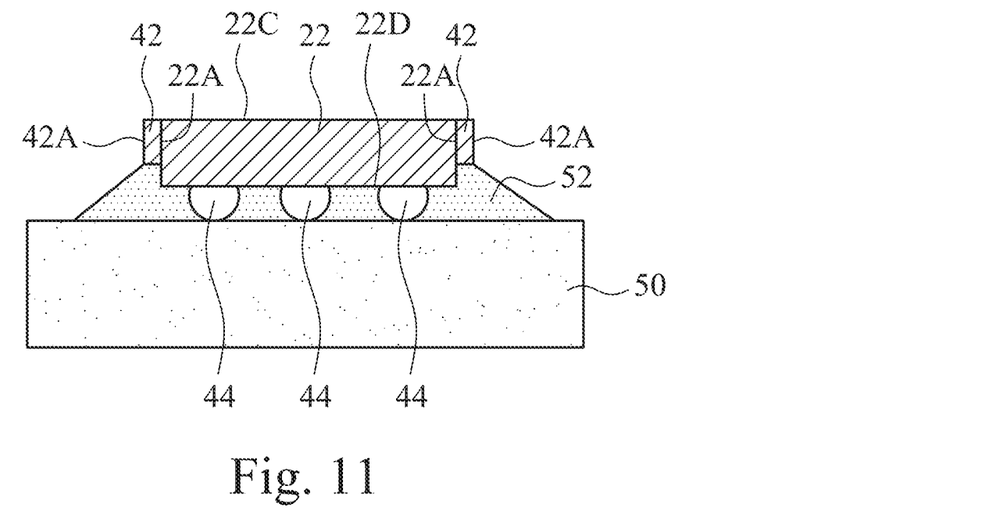

FIG. 11 illustrates an embodiment in which fillet 42 covers a top portion of sidewalls 22A of die 22, while a bottom portion of sidewalls 22A is not covered by fillet 42, wherein the top portion of sidewalls 22A is closer to surface 22C than surface 22D. Instead, underfill 52 contacts the bottom portion of sidewalls 22A. The packaging process for forming the structure in FIG. 11 may be essentially the same as shown in FIGS. 8 and 9, except fillet 42 is formed using the process shown in FIGS. 5 and 6. The resulting structure after the curing of underfill 52 is shown in FIG. 11. In this embodiment, underfill 52 at least contacts the bottom surface of fillet 42, so that fillet 42 and underfill 52 join together to from an integrated component, which may provide protection to the entire sidewalls 22A of die 22. When viewed from top, underfill 52 may encircle, and may contact, the lower portion of sidewalls 22A of die 22.

Figure 12:
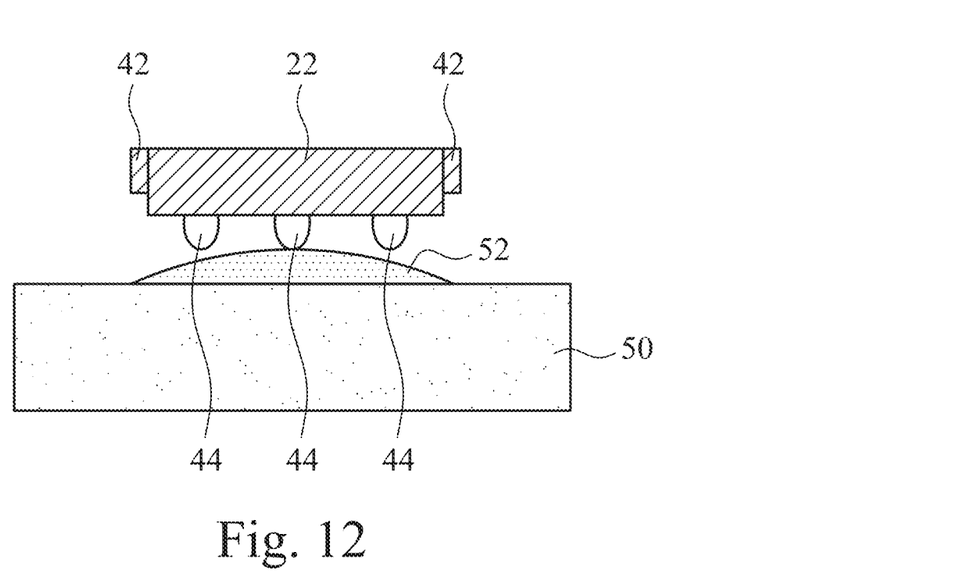
Figure 13:
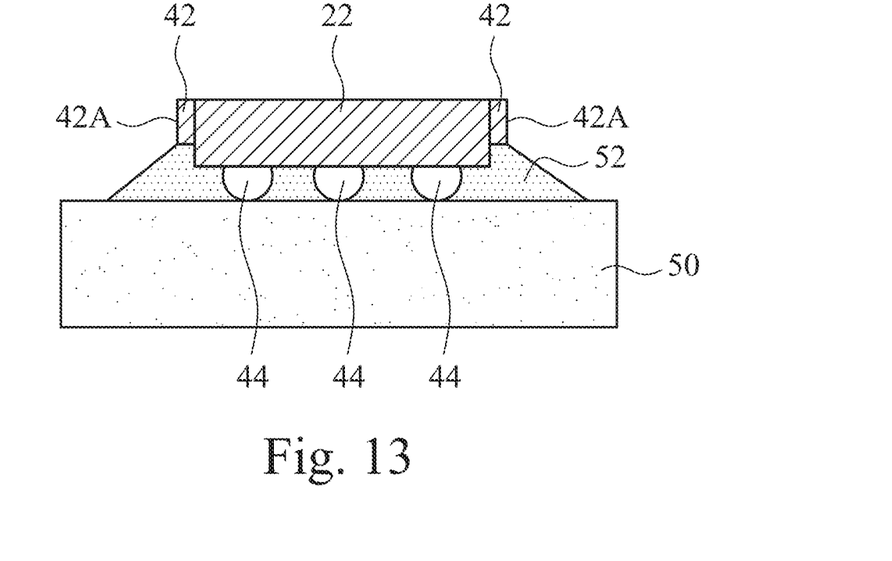

FIGS. 12 and 13 illustrate the bonding of die 22 and work piece 50 through no-flow underfill dispensing process. Referring to FIG. 12, underfill 52 is dispensed on work piece 50 first. Die 22, which has fillet 42 formed thereon, is then placed over work piece 50. A force is applied, so that solder bumps 44 penetrate through underfill 52 to contact the bond pads (not shown) on work piece 50. FIG. 13 illustrates a resulting structure. Underfill 52, besides filling the gap between die 22 and work piece 50, will also be squeezed aside. The amount and the thickness of underfill 52 are selected so that underfill 52 at least contacts the bottom of fillet 42, and may contact the sidewalls 42A of fillet 42. A reflow is then performed on solder bumps 44, followed by the curing of the pre-cured fillet 42 and underfill 52.

The no-flow underfill dispensing process may also be used to bond die 22 (as shown in FIG. 7) onto work piece 50. The resulting structure may also be represented using FIG. 11. In the resulting structure, fillet 42 covers a top portion of sidewalls 22A of die 22, while a bottom portion of sidewalls 22A is not covered by fillet 42. The bonding process may be essentially the same as shown in FIGS. 11 through 12.

Figure 14:
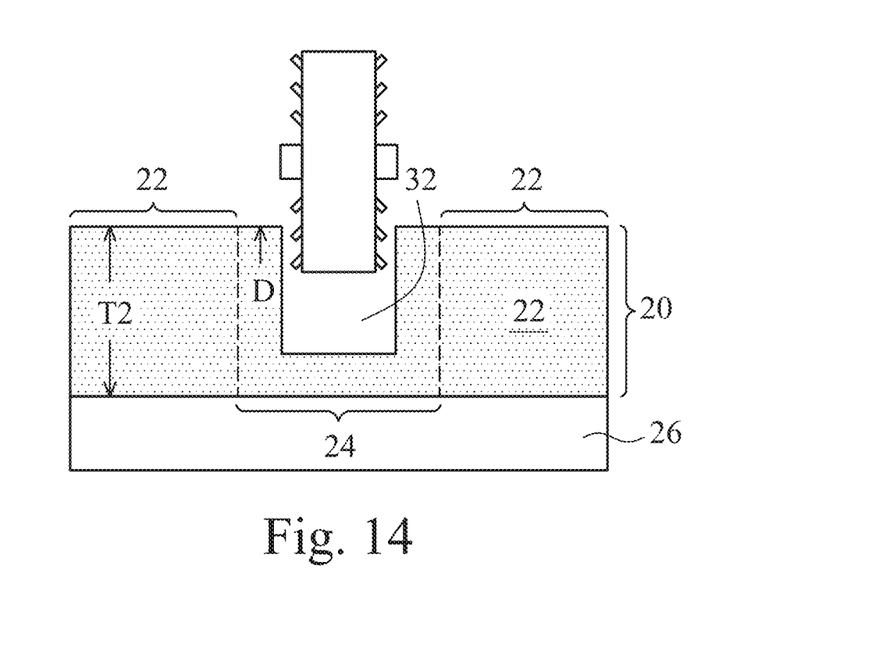
FIGS. 14 through 17 illustrate cross-sectional views of intermediate stages in the formation of fillets on sidewalls of dies, wherein a dicing-before-grinding process is used.
Figure 15:
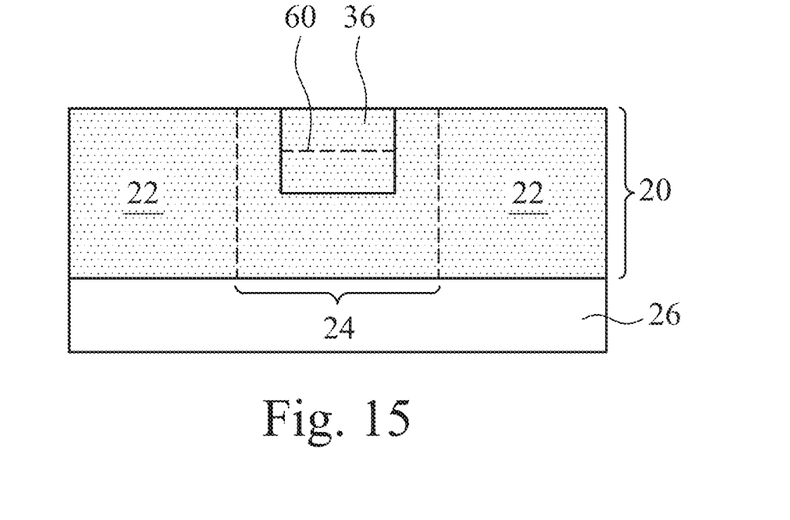

FIGS. 14 through 17 illustrate the cross-sectional views of intermediate stages in the formation of fillet 42 on the sidewalls of dies 22 in accordance with yet another embodiment. In this embodiment, the dicing-before-grinding (DBG) process is used. Referring to FIG. 14, a first die sawing is performed to form trench(es) 32. The top view of the structure shown in FIG. 14 may be essentially the same as the structure shown in FIG. 1A. In this embodiment, trenches 32 stop at an intermediate level between the top surface and the bottom surface of wafer 20, and do not extend to the bottom of wafer 20. In an embodiment, depth D of trenches 32 is between about 5 and about 90 percent of thickness T2 of dies 22. Next, as shown in FIG. 15, fillet material 36 is filled into trenches 32, and is then pre-cured. Similarly, fillet material 36 may fill trenches 32 fully, or fill only a lower portion of trenches 32, while an upper portion of trenches 32 is not filled. Dashed line 60 illustrates an exemplary top surface of fillet material 36.

Figure 16:
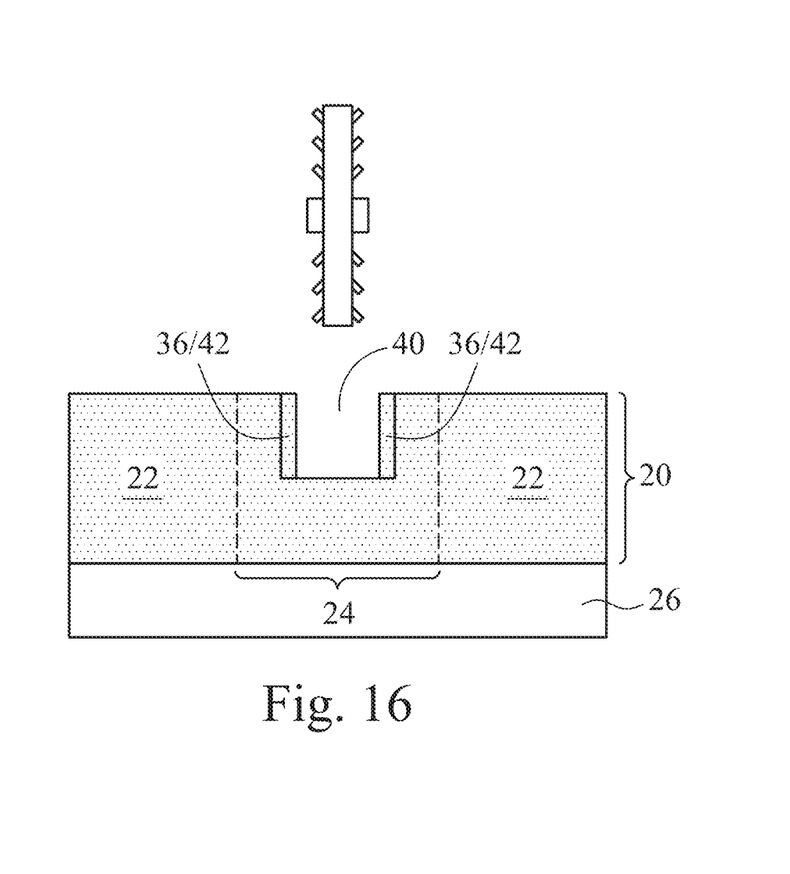
Figure 17:
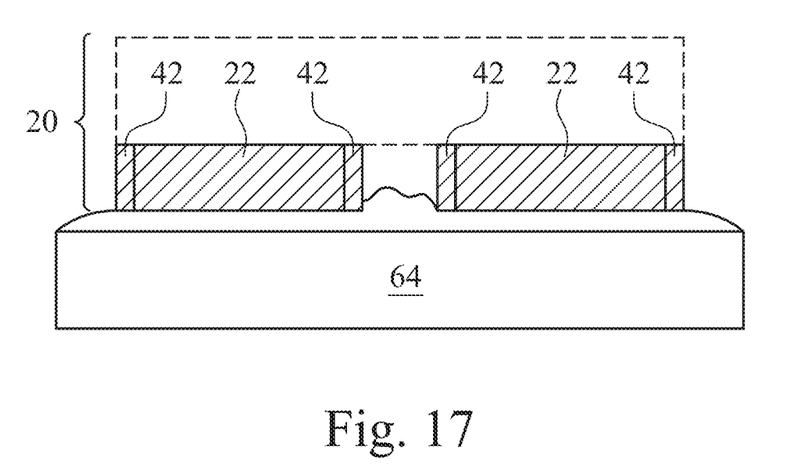

Next, as shown in FIG. 16, a second die sawing is performed. The second die sawing may reach essentially the same depth D into fillet material 36 as the first die sawing, although the depths may also be slightly different. After the second die sawing, fillets 42 are formed. Next, as shown in FIG. 17, tape 26 is removed from wafer 20. At this time, dies 22 are still connected to each other. A backside grinding is then performed, until dies 22 are separated, and fillets 42 are exposed. The dashed portion illustrates the portion of wafer 20 removed in the backside grinding. During the backside grinding, carrier 64 may be attached to the front side of wafer 20 to support dies 22 during the grinding. After the backside grinding, dies 22 are removed from carrier 64. In subsequent process steps, dies 22 are bonded to work pieces 50, which may be essentially the same as shown in FIGS. 8 through 13.

In accordance with embodiments, a die has a first surface, a second surface opposite the first surface, and sidewalls includes a first portion and a second portion, wherein the first portion is closer to the first surface than the second portion. A fillet contacts the first portion of sidewalls of the die and encircles the die. A work piece is bonded to the die through solder bumps, with the second surface facing the work piece. A first underfill is filled a gap between the die and the work piece, wherein the first underfill contacts the fillet, and wherein the first underfill and the fillet are formed of different materials.

In accordance with other embodiments, a die has a first and a second surface opposite the first surface. An underfill is disposed on sidewalls of the die and encircling the die, wherein the underfill covers substantially all of the sidewalls of the die. Substantially none of the underfill is directly over and contacting the first surface of the die, or under and contacting the second surface of the die.

In accordance with yet other embodiments, a method includes performing a first sawing through scribe lines of a wafer to form first trenches, wherein the scribe lines space a plurality of dies in the wafer apart from each other; filling a fillet material into the first trenches; performing a curing to at least partially cure the fillet material; and performing a second sawing through the fillet material to form second trenches, with portions of the fillet material remaining on opposite sides of the respective second trenches after the second sawing. The plurality of dies is separated from each other, with each of the plurality of dies having a fillet formed of a remaining portion of the fillet material. The fillet contacts sidewalls of the each of the plurality of dies.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A method comprising:
    performing a first sawing through scribe lines of a wafer to form first trenches, wherein the scribe lines divide the wafer into a plurality of dies;
    filling a fillet material into the first trenches, wherein the fillet material is a dielectric material;
    performing a second sawing through the fillet material to form second trenches, wherein each of the second trenches overlaps one of the first trenches, and wherein both the first trenches and the second trenches extend from a top surface of the wafer to stop at an intermediate level between a bottom surface and the top surface of the wafer; and
    separating the plurality of dies from each other, with each of the plurality of dies comprising a fillet formed of a remaining portion of the fillet material.

2. The method of claim 1, wherein the wafer comprises remaining portions overlapped by the first trenches and the second trenches, and the method further comprises performing a grinding to remove the remaining portions of the wafer to separate the plurality of dies from each other.

3. The method of claim 1 further comprising:
    bonding one of the plurality of dies onto a work piece through flip-chip bonding; and
    dispensing an underfill into a gap between the one of the plurality of dies and the work piece, wherein the underfill contacts the fillet.

4. The method of claim 1 further comprising:
    after the filling the fillet material and before the second sawing, performing a curing to partially cure the fillet material; and
    after the second sawing, fully curing the partially cured fillet material.

5. The method of claim 1, wherein the filling the fillet material comprises dispensing a dielectric material.

6. The method of claim 5, wherein the dispensing the dielectric material comprises dispensing an underfill.

7. A method comprising:
    performing a first sawing through scribe lines of a wafer to form first trenches, wherein the scribe lines space a plurality of dies in the wafer apart from each other;
    filling a fillet material into the first trenches, wherein after the filling the fillet material, a top surface of the fillet material is lower than a top surface of the wafer;
    performing a first curing to at least partially cure the fillet material;
    performing a second sawing through the fillet material to form second trenches, with portions of the fillet material remaining on opposite sides of the respective second trenches after the second sawing;
    performing a backside grinding on the wafer to separate the plurality of dies from each other, with each of the plurality of dies comprising a fillet formed of a remaining portion of the fillet material, wherein the fillet contacts sidewalls of the each of the plurality of dies;
    bonding one of the plurality of dies onto a work piece through flip-chip bonding; and
    dispensing an underfill into a gap between the one of the plurality of dies and the work piece, wherein the underfill contacts the fillet.

8. The method of claim 7, wherein one of the first and the second trenches extends from a top surface of the wafer to stop at an intermediate level between the top surface and a bottom surface of the wafer.

9. The method of claim 7 further comprising, before the performing the second sawing, performing a pre-cure to partially cure the fillet material.

10. The method of claim 7, wherein the fillet material contacts sidewalls of the wafer at points lower than a top surface of the wafer.

11. The method of claim 9 further comprising, after the second sawing, fully curing the partially cured fillet material.

12. The method of claim 7, wherein the filling the fillet material comprises dispensing a dielectric material.

13. The method of claim 12, wherein the dispensing the dielectric material comprises dispensing an underfill.

14. A method comprising:
    attaching a wafer to a tape;
    performing a first sawing to fully separate a plurality of dies in the wafer from each other;
    filling trenches separating the plurality of dies with a fillet material;
    curing the fillet material;
    performing a second sawing to saw through the fillet material to separate a plurality of dies in the wafer from each other, with each of the plurality of dies encircled by a remaining portion of the fillet material;
    separating the plurality of dies from the tape;
    bonding one of the plurality of dies to a work piece; and
    after the fillet material is sawed through, fully curing the fillet material on the one of the plurality of dies.

15. The method of claim 14, wherein after the curing the fillet material, the fillet material is partially cured.

16. The method of claim 14 further comprising, after the bonding, dispensing an underfill between the one of the plurality of dies and the work piece, with the underfill contacting the fillet material on the one of the plurality of dies.

17. The method of claim 14, wherein trenches formed by the first sawing penetrate through the wafer, with the tape exposed to the trenches, and the plurality of dies is fully separated from each other.

18. The method of claim 14, wherein the fillet material comprises a dielectric material.

19. The method of claim 14, wherein the fully curing the fillet material is performed after the bonding.

* * * * *